United States Patent [19]

Okumura

[11] Patent Number: 6,032,277
[45] Date of Patent: Feb. 29, 2000

[54] METHOD AND APPARATUS FOR LOGIC TESTING AN INTEGRATED CIRCUIT

[75] Inventor: Takaaki Okumura, Kasugai, Japan

[73] Assignee: Fujitsu Limited, Kawasaki, Japan

[21] Appl. No.: 09/026,530

[22] Filed: Feb. 20, 1998

[30] Foreign Application Priority Data

Jun. 6, 1997 [JP] Japan ................................... 9-149519

[51] Int. Cl.[7] ................................................. G01R 31/28
[52] U.S. Cl. ............................................. 714/724; 714/33
[58] Field of Search ..................................... 714/724, 739, 714/741, 742, 798, 26, 30, 32, 33, 34; 364/578, 580, 933.8

[56] References Cited

U.S. PATENT DOCUMENTS 5,212,443  5/1993  West et al. ............................... 714/724
5,477,139  12/1995 West et al. ............................ 324/158.1

FOREIGN PATENT DOCUMENTS 09005397  1/1997  Japan .

Primary Examiner—Trinh L. Tu
Attorney, Agent, or Firm—Staas & Halsey LLP

[57] ABSTRACT

An event driven system for testing logical operations of logic elements of an integrated circuit including an oscillation element. The system uses in/out data of the logic elements and net-list data of the logic circuit. An incoming event of the oscillator element has a signal incoming time and a signal incoming place, indicating a change in a signal by oscillation of the oscillation element. An incoming process of the incoming event includes generating a normal event having the same incoming time and the same incoming place as the incoming event, and generating a new incoming event having the same incoming time as the incoming event, but a different incoming time. The different incoming time is a changing time of a signal caused by oscillation of the oscillator element. The changing time is later than the incoming time of the incoming event.

21 Claims, 12 Drawing Sheets

METHOD AND APPARATUS FOR LOGIC TESTING AN INTEGRATED CIRCUIT

BACKGROUND OF THE INVENTION

The present invention relates generally to a method and apparatus testing logic circuits at the design stage of a semiconductor integrated circuit.

Testing of a semiconductor integrated circuit requires simulation of the logic operations of the logic circuits thereon. As the functional operation of a logic circuit is increased, the number of logic cells which comprise the logic circuit is also increased. The increased number of logic cells leads to an increase in the logic simulation time.

When a logical operation is complicated, as that of a logic circuit which comprises an oscillator element or the like, it is sometimes difficult, if not impossible to adequately model or express on a practically significant scale such a circuit. Even attempts to make the operations as close to physical operations as possible. In such a case, a logic testing apparatus should provide general-purpose functions corresponding to various types of logic circuits to aid the simulation of logic cells.

In designing a semiconductor integrated circuit, its logic circuits are simulated and tested prior to fabrication due to the high cost involved in fabricating such circuits. A testing inspection apparatus of an event-driven type is generally employed for such testing. A set of events is set in such a logic testing apparatus. Each event includes an incoming time, registered on a time axis from the current time of processing to a future time, an incoming place, and a renewed signal value. The logic test apparatus acquires a sub set of events associated with the current time of processing from the set of events and performs an incoming process for each event in the sub set. In the incoming process, the occurrence or generation of a new event is checked and the generated event is registered at the current or future time.

The incoming event generation process is repeated until no event to be processed at the current time is left. When all events are processed, the logic test apparatus renews the current time and repeats the aforementioned incoming process for the time at which the next event is registered.

An incoming process for a logic circuit shown in FIG. 1 will be discussed below. FIG. 2 illustrates the events which are produced in accordance with an incoming process.

When a signal at the output terminal X1 of a first inverter 51 changes to "0" from "1" at time tk0, a first event IV1 whose incoming time is tk0, incoming place is the output terminal X1 and renewed signal value is "0" is registered as shown in FIG. 2.

When the current time reaches time tk0, the logic test apparatus selects the first event IV1 and executes an incoming process for that event IV1. In accordance with the first event IV1, the logic test apparatus sets a signal at the output terminal X1 (incoming place) of the first inverter 51 to "0".

Subsequently, the test apparatus sets the fan-out of the inverter 51 (two in this case), and then sets the value of a signal at a first fan-out pin P1 (signal at the input terminal of a second inverter 52 at the succeeding stage) to "0". Then, based on that signal value, the test apparatus computes the value of a signal at the output terminal X2 of the second inverter 52.

The test apparatus determines if the signal value at the output terminal X2 differs from the signal value at the current time (tk0). In other words, the test apparatus determines that the signal value at the first fan-out pin P1 is "0" and the signal value at the output terminal X2 is "1". When the signal at the output terminal X2 differs from the signal value at the current time, the test apparatus obtains a rise delay time td10 of the second inverter 52 from prestored logic circuit data. Next, the test apparatus generates a second event IV2. As shown in FIG. 2, the second event IV2 has time tk1 after the delay time td10 from the current time tk0 as an incoming time, the output terminal X2 as an incoming place, and a signal value of "1".

When the incoming process for the first fan-out pin P1 is completed, the test apparatus generates an event at a new future time or the current time for a next fan-out pin P2 in a similar manner.

A third inverter 53 has a predetermined rise delay time td20. When a signal at an output terminal X3 is inverted to "1" from "0" as a signal at the fan-out pin P2 of the third inverter 53 changes, the test apparatus generates a third event IV3. As shown in FIG. 2, the third event IV3 has time tk2 after the delay time td20 from the current time tk0 as an incoming time, the output terminal X3 as an incoming place, and a signal value of "1".

When the incoming process for every event at the current time tk0 is completed, the test apparatus updates the current time and executes the above-described incoming process for a time at which a next event is registered.

As discussed above, an event is generated when a signal at the output terminal of one inverter changes. The event used to transfer a change in the signal to the fan-out pin of the inverter.

In such a logic circuit, the terminal structure of a logical model is the same as that of a physical model. In this case, a library representing the logical models of individual cells and a library representing the physical models thereof are stored in a common master library using the concept of sharing cells. The common master library prevents inconsistency between the library of logical models and the library of physical models.

Referring now to FIG. 3, a logic circuit which comprises a fixed-period oscillator element 60 having an odd number of inverters 61 to 65 connected in series is shown. The oscillator element 60 outputs a signal which is an input signal to a first inverter 61. That is, output signal is fed back to the first inverter 61. The signal feedback causes the oscillator element 60 to generate a signal having a predetermined period. An event drive type logic inspection apparatus carries out logic test on such a logic circuit as follows.

When initiating logic testing or at the time of initializing the logic circuit, the test apparatus sets any input signal or output signal of the individual inverters 61–65 which is unsettled or indeterminate to an predetermined unsettled signal value. As a result, the oscillator element 60 is stabilized without oscillating. To make the oscillator element 60 oscillate, therefore, a signal of "1" or "0" for starting oscillation is input to the oscillator element 60. As shown in FIG. 4, the fixed-period oscillator element 60 is provided with a pseudo input terminal 66 for receiving the input signal. At the time of initiating oscillation, a signal of "1" or "0" is externally input to the oscillator element 60 via the pseudo input terminal 66.

Because the pseudo input terminal 66 is needed for logic testing of the oscillator element 60, however, the cell structure of the logical model differs from that of the physical model. The inconsistency between the logical models and the physical models of cells that comprise the oscillator element 60 complicates management of the cell library. In this case, the library of logical models and the library of physical models are managed separately, which undesirably requires inspection and synchronous renewal between the separately managed physical and logical models.

Some semiconductor integrated circuits comprise a variable oscillator element like a PLL (Phase-Locked Loop) element. Testing of such a logic circuit requires logic testing of elements including the PLL element. To accomplish the function of the PLL element, with regard to the oscillation frequency for the voltage of a voltage controlled oscillator (VCO), multiple VCO models may be prepared with multiple oscillation periods according to the resolution of the VCO. Based on a phase difference between a comparison signal and a feedback signal input to the PLL element, the optimal one of the multiple models is properly selected.

FIG. 5 shows an example of the VCO model. In FIG. 5, there are a plurality of fixed-period oscillator elements 60 comprising an odd number of inverters with different oscillation periods. Signals from the individual fixed-period oscillator elements 60 are sent to a selector 67. The selector 67 selects the fixed-period oscillator element 60 which outputs a signal having an oscillation period according to a phase difference between the comparison signal and the feedback signal, and causes that oscillator element 60 to output the signal.

However, this model is not practical because the constituents (VCO models) of the PLL element occupies most of the logic circuit including the PLL element to be tested. Japanese Unexamined Patent Publication No. Hei 9-5397 discloses an apparatus which reduces the number of VCO models as a solution to such a problem. The apparatus is designed based on the fact that the oscillation period of a PLL element and the delay time of the feedback signal to the comparison signal are fixed in accordance with the circuit structure. The apparatus generates a plurality of periods by adjusting the clock input timing based on the results of the previous measurement of the delay of the feedback path. In this case, for logic testing of a logic circuit including a PLL element, the delay of the feedback path is measured every time the circuit is modified.

In view of the above, as shown in FIG. 6, logic test on a PLL element 70 uses a first oscillator 71 whose oscillation period is shifted in the positive direction by time "d" with respect to the target oscillation period of the PLL element 70 and a second oscillator 72 whose oscillation period is shifted in the negative direction by time d. The first oscillator 71 includes a NOR gate 74, an AND gate 75, two inverters 76 and 77 and an AND gate 78. The second oscillator 72 includes the NOR gate 74, the AND gate 75, the two inverters 76 and 77 and an AND gate 79. A phase comparator 73 provides the first oscillator 71 or the second oscillator 72 with a signal S1 according to a phase difference between an external clock REF for the comparison signal and a feedback signal FB. When the external clock REF is delayed from the feedback signal FB, the first oscillator 71 outputs a signal S3 for elongating the oscillation period, in response to the signal S1. When the external clock REF leads to the feedback signal FB, the second oscillator 72 outputs a signal S3 for shortening the oscillation period, in response to the signal S1. The signal from the first oscillator 71 or the second oscillator 72 is input to the phase comparator 73 via a circuit 80 and a frequency divider 81, which are formed on the feedback path. As apparent from the above, the logic test attempts to spontaneously adjust the phase without affecting the delay of the circuit 80.

The delay of the circuit 80, however, keeps oscillation delayed or advanced while the signal S3, indicative of a change in oscillation period, reaches the phase comparator 73 after it is output from the first oscillator 71 or the second oscillator 72. Therefore, the phase adjusting function does not work satisfactorily. Further, the feedback signal FB may be stopped due to a logical error in the circuit 80 in the physical PLL element. In this case, the PLL element 70 determines that the frequency-dividing ratio of a frequency divider 81 is large and gradually shortens the oscillation period. When the comparison signal REF is stopped, on the other hand, the PLL element 70 makes the oscillation period gradually longer.

In the logical model of the PLL element 70 or the model which expresses the PLL element 70 shown in FIG. 6 by the two oscillators 71 and 72, however, the logic circuit keeps operating in the proper period even if the feedback signal FB is stopped, because the periods of the first and second oscillators 71 and 72 are fixed. Thus, a logical error in the circuit 80 may be erroneously overlooked. The PLL element described in the aforementioned Japanese unexamined patent publication also has such a problem.

Further, the oscillation period in the PLL element in either the apparatus described in the aforementioned publication or the logic circuit in FIG. 6 is determined based on the circuit structure. The oscillation period cannot therefore follow up the external clock REF or the switching of the frequency-dividing ratio of the frequency divider 81.

Unlike an element whose operation is logically determined, a PLL element has an analogous property. It is thus difficult to directly adapt no event driven type logic test which can adequately test oscillator circuits. Further, the inclusion of an oscillator in a PLL element makes logic test more difficult.

Accordingly, it is an object of the present invention to provide a logic testing and method, a logic testing apparatus which ensure easier logic testing of a logic cell having an oscillation function.

SUMMARY OF THE INVENTION

To achieve the above objective, the present invention provides a method of performing a logic test of a logical operation on each of a plurality of logic elements in a logic circuit in an event driven system, based on input data of the logic circuit and net list data of a fan-in-fan-out structure of the logic circuit, at least one of the logic elements including an oscillation element, the method comprising the steps of: providing a self incoming event of the oscillator element, the self incoming event having a signal incoming time and a signal incoming place, indicating a change in a signal by oscillation of the oscillator element; and performing an incoming process for the self incoming event, the incoming process performing the substeps of: generating a normal event having the same incoming time and the same incoming place as the self incoming event; and generating a new self incoming event having the same incoming place as the self incoming event and a changing time of a signal caused by oscillation of the oscillator element as a signal incoming time, the changing time being later than the incoming time of the self incoming event.

The present invention further provides a logic testing apparatus for performing a logic test of a logical operation on each of a plurality of logic elements in a logic circuit in an event driven system, at least one of the logic elements including an oscillator element, the apparatus comprising: a memory for storing logic circuit input data and net list data of the logic circuit; and a processor for processing a normal event and a self incoming event with regard to the oscillator element; wherein the processor operates to: provide a self incoming event to the oscillator element, the incoming event having a signal incoming time and a signal incoming place, indicating a change in a signal by oscillation of the oscillator element; and perform an incoming process for the self incoming event for generating a normal event having the same incoming time and the same incoming place as the self incoming event; and for generating a new self incoming event having the same incoming place as the self incoming event and a changing time of the oscillation signal caused by oscillation of the oscillator element as a signal incoming time, the changing time being later than the incoming time of the self incoming event.

The present invention provides a storage medium having computer readable program code thereon for performing logic testing of a logical operation on each of a plurality of logic elements in a logic circuit in an event driven system, at least one of the logic elements including an oscillator element, the logic testing being performed based on logic circuit input data and net list data of a fan-in-fan-out structure, the program code executing the steps of: providing a self incoming event to the oscillator element, the self incoming event having a signal incoming time and a signal incoming place, indicating a change in a signal by oscillation of the oscillator element; and performing an incoming process for the self incoming event, the incoming process performing the substep of: generating a normal event having the same incoming time and the same incoming place as the self incoming event; and generating a new self incoming event having the same incoming place as the self incoming event and a changing time of a signal caused by oscillation of the oscillator element as a signal incoming time, the changing time being later than the incoming time of the self incoming event.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

Figure 7:
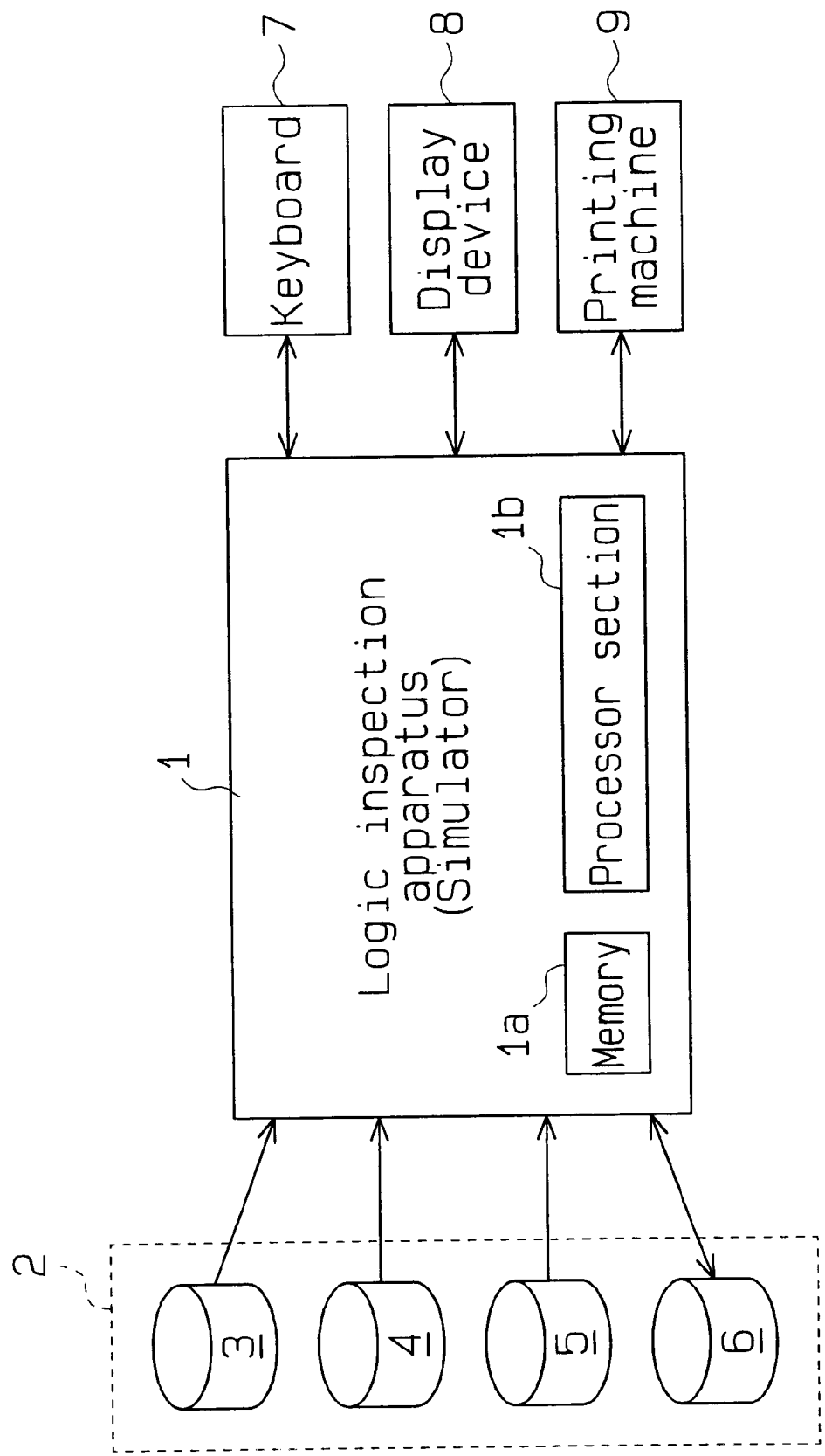
FIG. 7 is a block diagram illustrating the system structure of a logic testing apparatus according to the present invention.

As shown in FIG. 7, a logic test system for a semiconductor integrated circuit device has a logic test apparatus (hereinafter called "simulator") 1, a magnetic disk unit 2, a keyboard or other input device 7, a display device 8 and a printing machine 9.

The magnetic disk unit 2 stores a first file 3 including logic circuit data, a second file 4 including input/output data, a third file 5 containing a logic inspection program, and a fourth file 6 including test result data. The simulator 1 has a memory 1a for storing various kinds of data and a processor section 1b. The simulator 1 operates in accordance with the logic test program stored in the third file 5.

The logic circuit data file 3 stores logic circuit data of a semiconductor integrated circuit which is provided by a user (e.g., a circuit designer). The logic circuit data includes interconnect data of multiple logic cells which comprise the logic circuit and data which expresses the logic cells using a net list of a fan-in-fan-out structure.

Each logic cell of the integrated circuit has logic cell data including delay time data. The delay time data represents a time (delay time) needed from a point when a signal input to the input terminal of the logic cell changes to a point when a signal output from the output terminal (fan-out) of the cell varies in response to the change in the input signal.

The delay time data includes: a falling delay time tdHL and rising delay time tdLH. The falling delay time tdHL is the time required for the output signal to change to "0" from "1" (it falls to an L level from an H level) in response to a change in the input signal. The rising delay time tdLH is the time required for the output signal to change to "1" from "0" (it rises to an H level from an L level) in response to a change in the input signal.

Figure 8:
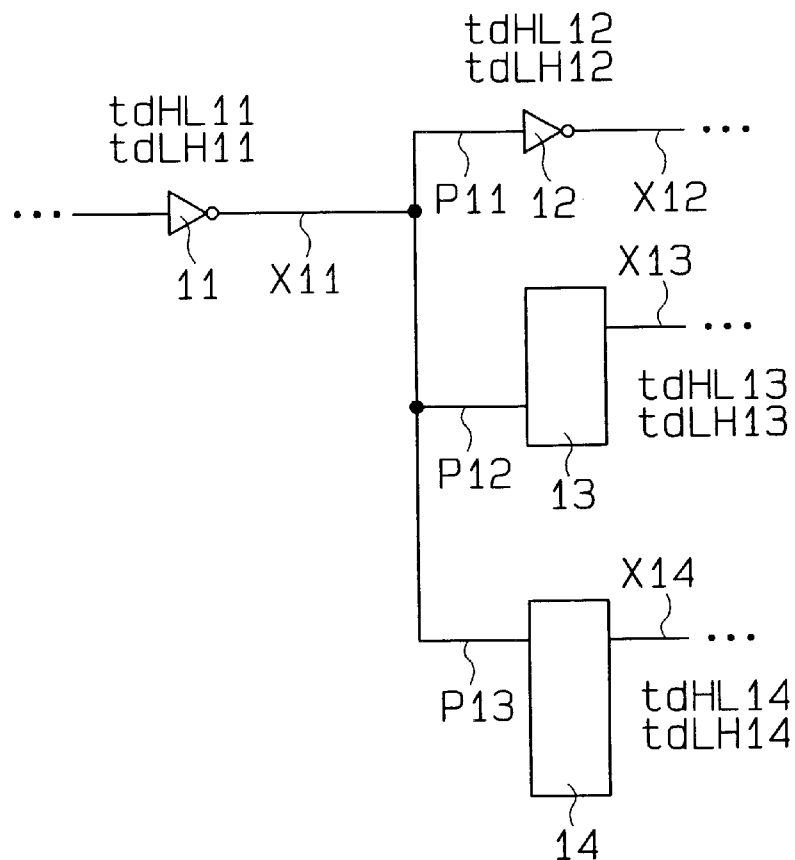
FIG. 8 is a schematic block diagram showing a part of a semiconductor integrated circuit.

In a logic circuit which has no oscillator element, as shown in FIG. 8, the delay time data comprising the falling delay times tdHL and rising delay times tdLH of individual cells 11 to 14 is included in the logic cell data. When the falling delay time tdHL of the first inverter element 11 is 7 nanoseconds and the rising delay time tdLH is 8 nanoseconds, for example, delay time data comprising the 7 nanoseconds and 8 nanoseconds is stored in the logic cell data of the first inverter element 11.

Figure 9:
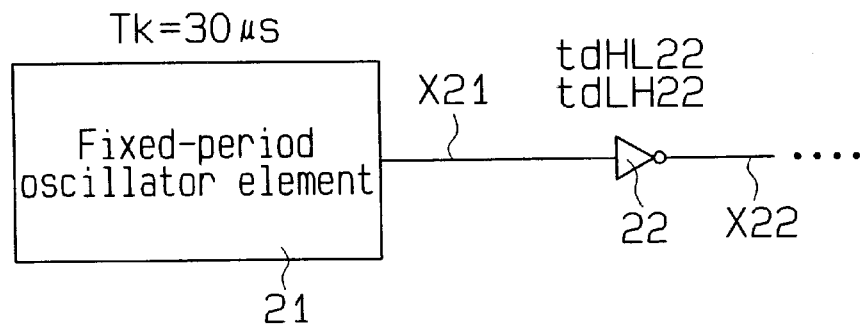
FIG. 9 is a schematic block diagram of a logic circuit including a fixed-period oscillator element.

For a logic circuit including a fixed-period oscillator element 21 shown in FIG. 9, the logic cell data of the oscillator element 21 includes data which defines that the element itself is the fixed-period oscillator element 21 (logic cell having an oscillation function) and data of the oscillation period TK of the oscillator element 21. When the oscillation period TK of the oscillator element 21 is 30 microseconds, for example, period data indicating the 30 microseconds is stored in the logic cell data of the oscillator element 21.

Figure 10:
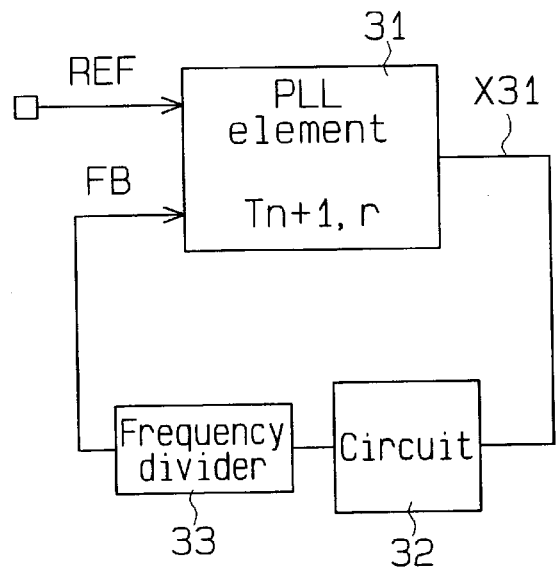
FIG. 10 is a schematic block diagram of a logic circuit including a PLL element.

Referring now to FIG. 10, in a logic circuit including a PLL element 31, the logic cell data of the PLL element 31 includes data which defines that the element itself is the PLL element 31 (logic cell with an oscillation function). To compute a new oscillation period Tn+1 (=Tn±r×dt), a compensation value (=±r×dt) is added to the current oscillation period Tn. The logic cell data includes data of the parameter "r" for computing a compensation value for the phase difference dt between an external clock REF as a comparison signal and a feedback signal FB.

Figure 11:
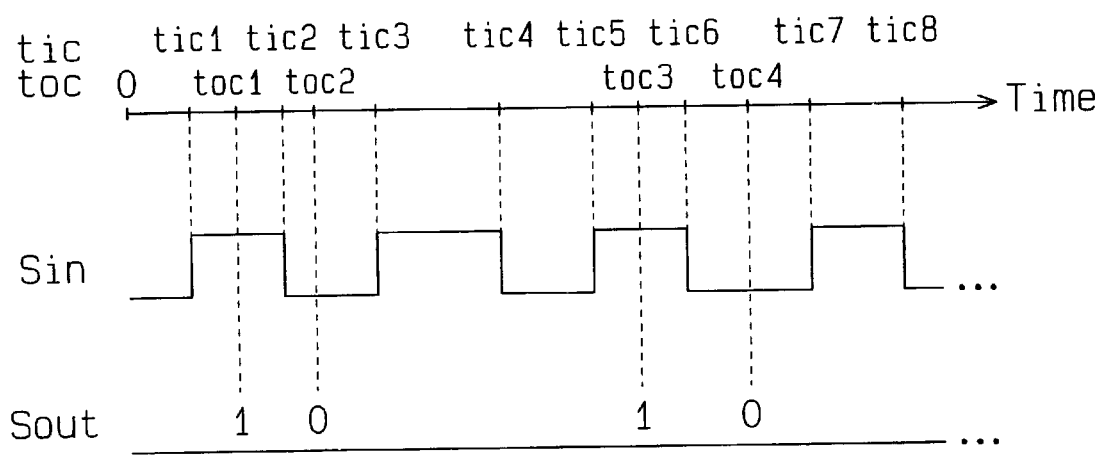
FIG. 11 is a timing chart showing an external input signal and an external output signal which are used in logic testing.

Referring again to FIG. 7, the input/output signal data file 4 stores input signal data and output signal data. The input signal data is associated with a previously provided external input signal Sin to be supplied to the logic circuit. The input signal data comprises data of times (signal change times) tic at which the external input signal Sin changes (from "1" to "0" or from "0" to "1") and data of the updated values of the input signal Sin at the change times tic (the values of "0" when the input signal Sin changes to "0" from "1" or the values of "1" when it changes to "1" from "0"). When the external input signal Sin varies as shown in FIG. 11, the change times tic are time tic1, time tic2, time tic3, time tic4, time tic5, time tic6, time tic7, time tic8, and so forth from the inspection start time (t=0 second). The updated values at the individual change times tic are "1" at time tic1, "0" at time tic2, "1" at time tic3, "0" at time tic4, "1" at time tic5, "0" at time tic6, "1" at time tic7, and "0" at time tic8.

The output signal data is associated with a previously provided external output signal Sout which is expected to be output from the logic circuit. The output signal data comprises data of times toc at which the external output signal Sout changes (from "1" to "0" or from "0" to "1") and data of the values of the external output signal Sout at the times toc (the values of "0" when the output signal Sout changes to "0" from "1" or the values of "1" when it changes to "1" from "0"). When the external output signal Sout varies as shown in FIG. 11, the change times toc are time toc1, time toc2, time toc3, time toc4, and so forth from the test start time (t=0 second). The updated values at the individual change times toc are "1" at time tod1, "0" at time toc2, "1" at time toc3, and "0" at time toc4.

Referring again to FIG. 7, the logic test program file 5 stores the logic test program. The logic test program causes the simulator 1 to execute logic test and performs logic test on logic circuit data given by a user by the event driven system.

The test result data file 6 stores the results of the logic test performed by the simulator 1. The display device 8 displays the results of the logic test and the printing machine 9 prints the results on paper.

The simulator 1 controls the magnetic disk unit 2, the display device 8 and the printing machine 9 to execute logic testing. The simulator 1 loads the logic test program from the logic test program file 5, and carries out logic test on the logic circuit using the logic circuit data and the input/output signal data in accordance with the program.

The simulator 1 reads the logic circuit data from the logic circuit data file 3, and stores the data in the memory 1a. The memory 1a stores data of logic cells comprising the logic circuit and net list data.

The simulator 1 reads input signal data and output signal data for the logic circuit from the input/output signal data file 4 and stores such data in the memory 1a. That is, the memory 1a stores individual change times tic for the input signal data and updated signal values at the respective change times tic. The memory 1a also stores individual change times toc for the output signal data and updated signal values at the respective change times toc.

The processor section 1b in the simulator 1 generates an event associated with the current time from a set of events that are registered at times including and following the current time in logic testing. Each event comprises an incoming time, an incoming place and a updated signal value. When a signal at the output terminal of a cell to be inspected changes in accordance with a change in the signal which is input to that cell, the individual elements of an event are defined as follows. The incoming place is the output terminal of that cell, the incoming time is the time at which the signal at the output terminal changes, and the updated signal value is a value after the occurrence of a change in the signal at the output terminal. The processor section 1b executes an incoming process for each event. In the incoming process, the processor section 1b generates a new event and registers that event at the current or a further time.

Further, the processor section 1b affixes information indicative of the type of an event generated, to that event at the time of generating the event. The types of events are a normal event and a special event (self incoming event). The processor section 1b affixes information of the target event being a normal event to logic cells, such as an inverter element, an OR gate element, an AND gate element, a NOR gate element, an exclusive OR gate element and a flip-flop element, which have determined logical operations. The processor section 1b affixes information of the target event being a special event to a logic cell, such as the fixed-period oscillator element or PLL element, which has an oscillation function.

A normal event is generated to transfer a change in a signal to a logic cell which is located at the subsequent stage of one cell. A special event is generated to show a change in a signal caused by the self oscillation of a logic cell which has an oscillation function. At the time of generating an event, the processor section 1b determines if that event is a normal event or a special event based on the type of cells included in the logic cell data. The simulator 1 executes a common incoming process regardless of whether or not the logic circuit has an oscillation function. That is, the simulator 1 performs an incoming process on a circuit with no oscillation function (FIG. 8), a circuit with the fixed-period oscillator element 21 (FIG. 9) and a PLL oscillator element (FIG. 10) in accordance with a flowchart illustrated in FIG. 12.

Figure 12:
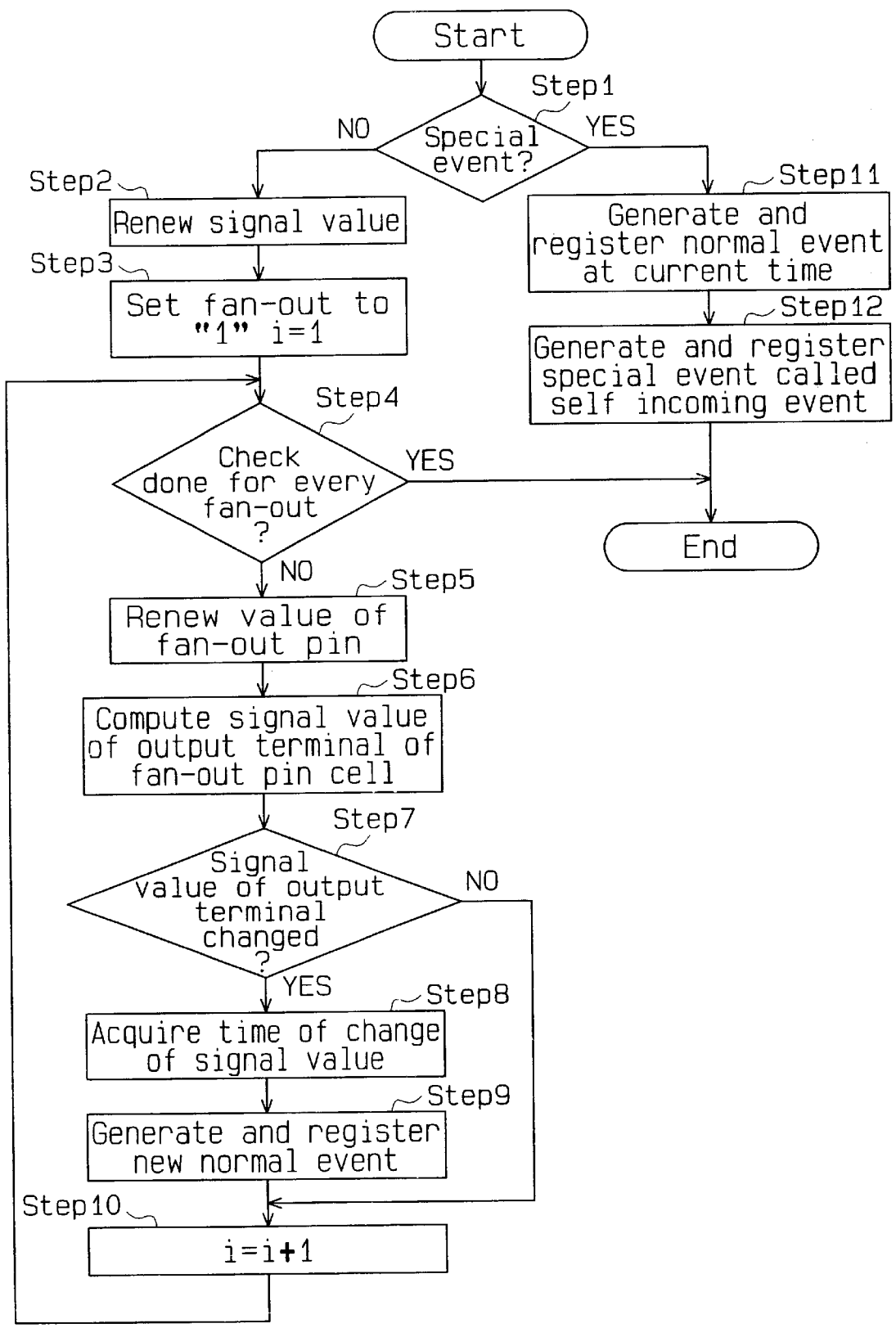
FIG. 12 is a flowchart illustrating an incoming process according to the present invention.

The incoming process carried out by the processor section 1b will now be discussed with reference to the flowchart in FIG. 12.

In step 1, the processor section 1b determines if a target event is a special event. When the event is a special event, the processor section 1b proceeds to step 11. When the event is a normal event, the processor section 1b proceeds to step 2.

In step 2, the processor section 1b updates the value of the signal at the output terminal of a target cell in accordance with the updated signal value of that event.

In the subsequent step 3, the processor section 1b sets a value i of a fan-out pin number counter to "1".

In step 4, the processor section 1b determines whether or not every fan-out has been checked. If the value i of the fan-out pin number counter is greater than the fan-out of the target cell. The fan-out is computed from the net list data which indicates the connection to the output terminal of the target cell. When three cells are connected to the output terminal of the target cell, for example, the fan-out is "3". When the value i of the fan-out pin number counter is greater than the fan-out, the processor section 1*b* terminates the subsequent processing. When the value i of the fan-out pin number counter is equal to or smaller than the fan-out, the processor section 1*b* goes to step 5.

In step 5, the processor section 1*b* updates the signal value at a fan-out pin based on the net list data. The fan-out pin corresponds to the value i of the fan-out pin number counter.

Subsequently, the processor section 1*b* acquires the signal value (renewed signal value) at the output terminal of a cell at the succeeding stage in association with a change in the signal at the fan-out pin.

In step 7, the processor section 1*b* determines if the renewed signal value differs from a signal value at the current time. That is, the processor section 1*b* determines if an input signal to the cell at the subsequent stage changes the value of the output signal from that cell. When the renewed signal value differs from the signal value at the current time, the processor section 1*b* moves to step 8. When those signal values are identical, the processor section 1*b* goes to step 10.

In step 8, the processor section 1*b* acquires the delay time data (the rising delay time or falling delay time) of the cell at the subsequent stage from the logic cell data of that cell.

In step 9, the processor section 1*b* generates a new normal event. In the new normal event, the incoming time is a time located apart from the current time by the delay time, and the incoming place is the output terminal of the cell at the subsequent stage. Step 9 completes the incoming process for the target fan-out pin.

In step 10, the processor section 1*b* increments the value i of the fan-out pin number counter and returns to step 4. The processor section 1*b* sequentially generates new normal events until the incoming process for all of the fan-out pins is finished. When the incoming process for every event at the current time is completed at the current time, the processor section 1*b* updates the current time. In other words, the processor section 1*b* executes the incoming process on an event at a further time closest to the current time and sets the time associated with that event as a new current time.

In step 11, the target event is a special event. The processor section 1*b* generates a new normal event for transferring a signal change to the cell at the subsequent stage. In this normal event, the incoming time is the current time, the incoming place is the output terminal of the cell at the subsequent stage, and the renewed signal value is the inverted signal value at the current time. When the generation of the new normal event is completed, the processor section 1*b* proceeds to step 12.

In step 12, the processor section 1*b* generates a self incoming event in which the incoming time is a predetermined time interval added to the current time, and the incoming place is the output terminal of the cell at the preceding stage. A self incoming event does not have a renewed signal value. The processor section 1*b* affixes information indicative of a special event to the self incoming event and then temporarily terminates the following process. In the next control cycle, the processor section 1*b* processes the normal event, generated in step 11.

A description will now be given of an incoming process for a logic circuit which has no oscillation function (see FIG. 8). In the incoming process, the individual output terminals X11, X12, X13 and X14 of the logic circuit are incoming places.

Figure 13:
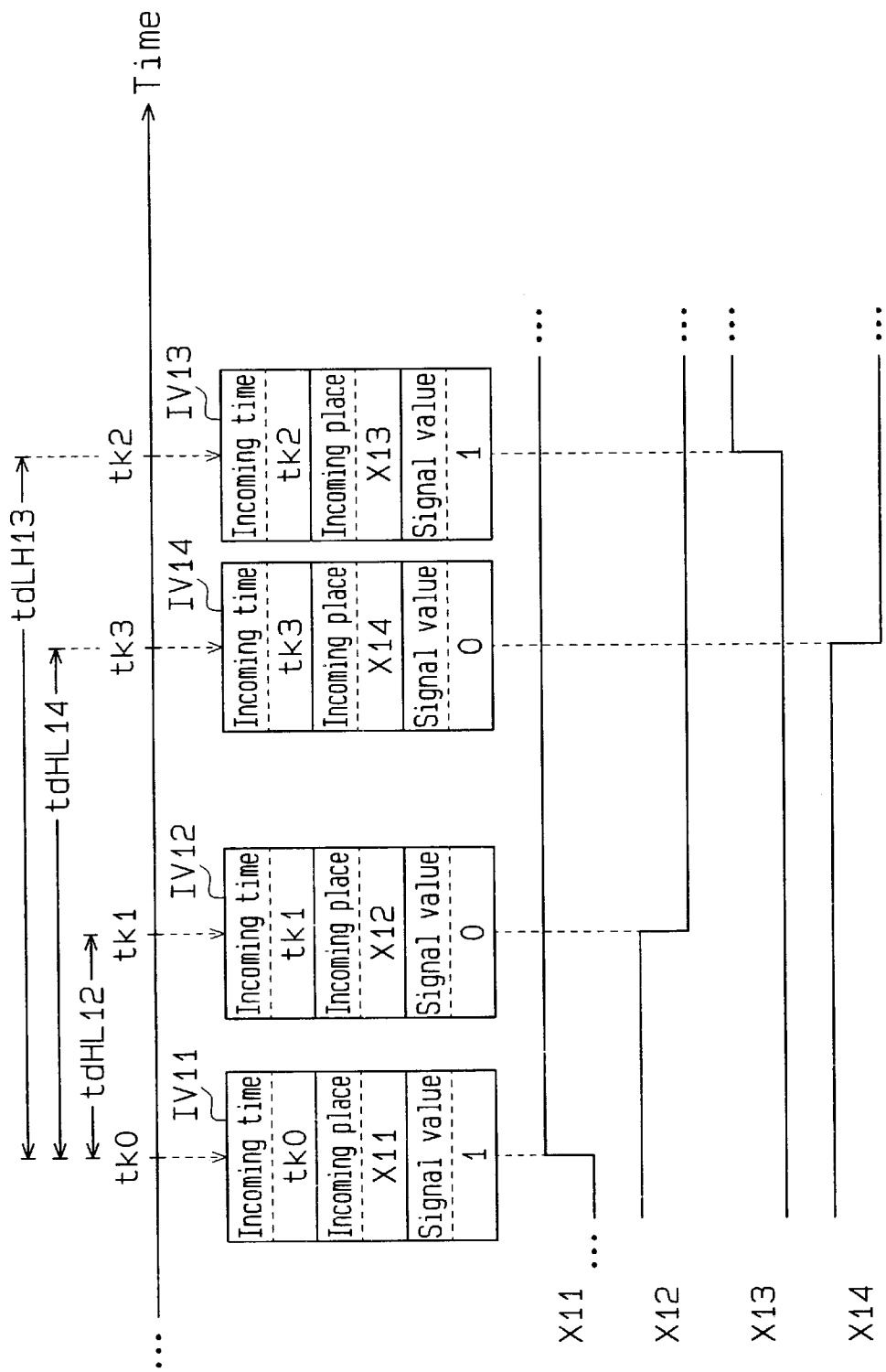
FIG. 13 is a schematic diagram showing events which are generated with respect to the logic circuit of FIG. 8.

When the input signal to the first inverter element 11 changes to "0" from "1", the signal at the output terminal X11 (incoming place) of the inverter element 11 changes to "1" from "0" as shown in FIG. 13. The time of the change in the signal is defined as the current time tk0. A first normal event IV11 is generated in which the current time tk0 as the incoming time, the output terminal X11 of the first inverter element 11 as the incoming place and the renewed signal value is "1". When that event IV11 is selected, the processor section 1*b* executes an incoming process.

The processor section 1*b* renews the signal at the output terminal X11 to "1" in accordance with the updated signal value of the first normal event IV11, and updates the signal at the fan-out pin P11. The updated signal is input to the second inverter element 12.

In accordance with a change in the signal from "0" to "1", the processor section 1*b* determines if the signal value at the output terminal X12 of the second inverter element 12 is updated to "0" from "1". The time tk1 at which the signal at the output terminal X12 changes is the falling delay time tdHL12 of the second inverter element 12 passed from the current time.

As the signal at the output terminal X12 changes, the processor section 1*b* generates a new second normal event IV12 with the time tk1 as the incoming time, the output terminal X12 as the incoming place and the updated signal value of "0" as mentioned above. This completes an incoming process for the first fan-out pin P11.

Likewise, the processor section 1*b* performs incoming processes for the fan-out pins P12 and P13 to sequentially generate third and fourth normal events IV13 and IV14 in accordance with the operations of the cells 13 and 14. The incoming process at the current time tk0 is executed until the incoming process for every event at the current time tk0 is finished.

Figure 14:
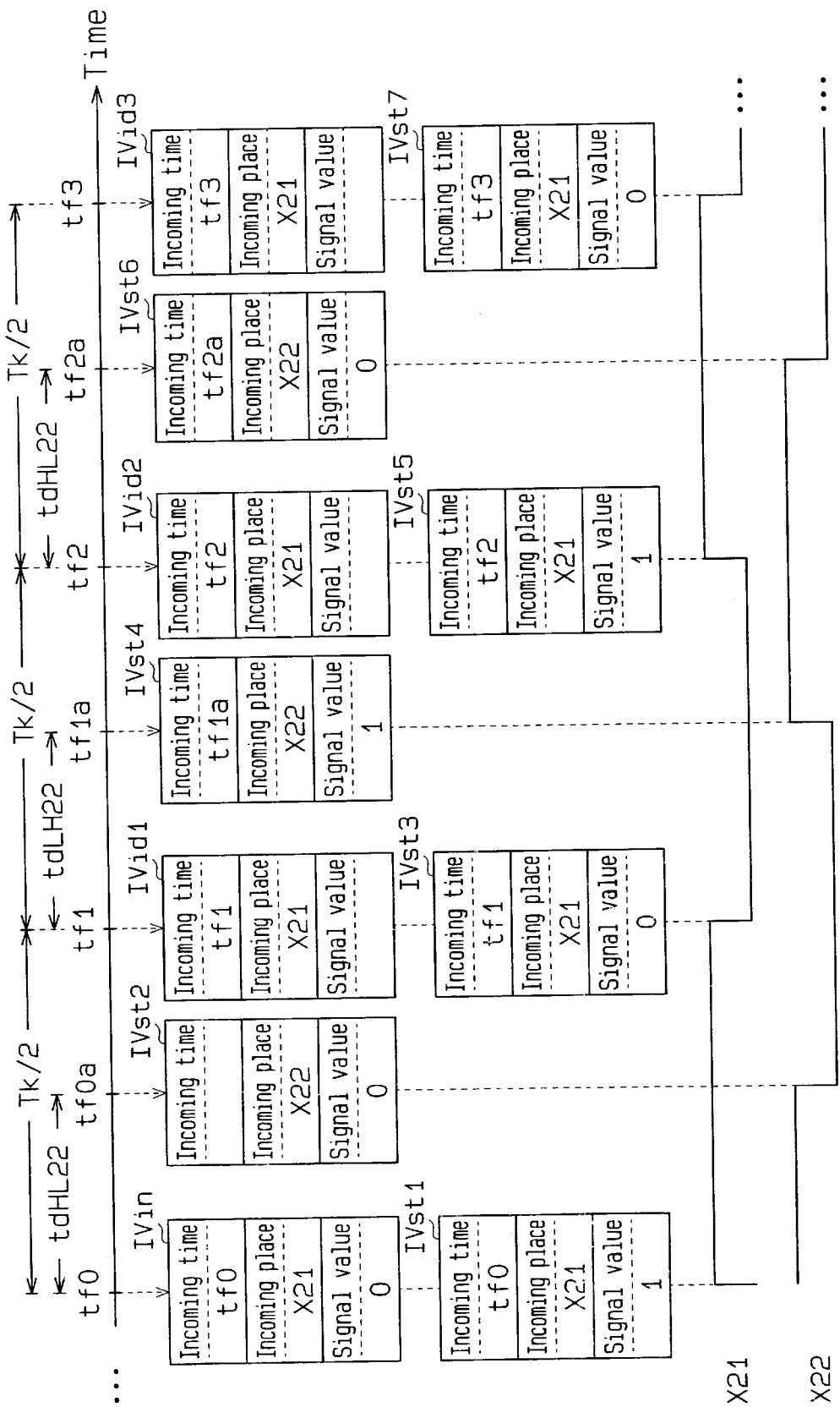
FIG. 14 is a block diagram showing events which are generated with respect to the logic circuit of FIG. 9.

An incoming process for a logic circuit including the fixed-period oscillator element 21 (see FIG. 9) will be described below referring to FIG. 14. In this incoming process, individual output terminals X21 and X22 are incoming places.

With the initialization of the logic circuit completed, an initial self incoming event IVin is generated in which the oscillation start time tf0 of the fixed-period oscillator element 21 is the incoming time and the output terminal X21 of the oscillator element 21 is the incoming place. The signal at the output terminal X21 of the fixed-period oscillator element 21 has previously been set to "0" as an initial value. When the logic circuit is initialized, the signal at the output terminal X21 is set to "1". Because the target cell is the fixed-period oscillator element 21, the initial self incoming event IVin is a special event, as opposed a normal event (FIG. 12, step 11). Whether or not the target event is a special event is determined on the basis of the data affixed to the logic cell data of the fixed-period oscillator element 21.

When the initial self incoming event IVin is selected, the processor section 1*b* generates a first normal event IVst1 for transferring a signal change to the inverter element 22 at the subsequent stage. In the first normal event IVst1, the incoming time is the current time tf0, the incoming place is the output terminal X21 and the renewed signal value is the initial value inverted or "1".

Thereafter, the processor section 1*b* generates a self incoming event IVid1 in which the incoming time is time tf1 (=tf0+(Tk/2)) that is a half period of the fixed period Tk of the fixed-period oscillator element 21 added to the current time tf0, and the incoming place is the output terminal X21 of the fixed-period oscillator element 21. The self incoming event IVid1 does not have a renewed signal value. The processor section 1b affixes information of the target event being a special event to the self incoming event IVid1.

The reason the incoming time of the self incoming event IVid1 has been determined as the time tf1 will be discussed below. The output signal of the fixed-period oscillator element 21 has a period Tk with a duty ratio of 50%, and its value is inverted every half period (=Tk/2). To simulate the oscillating operation of the oscillator element 21, therefore, it is necessary to generate a new event at a time at which the signal value is inverted. In this respect, a time which is the time Tk/2 elapsed from the current time tf0 is set as the incoming time. When the oscillation signal has a duty ratio of other than 50%, the time at which the signal is inverted is set as the incoming time. In this case, the time to be added to the current time is computed based on that duty ratio and the oscillation period.

When the first normal event IVst1 is selected for an incoming process at the current time tf0, the processor section 1b generates a new second normal event IVst2. In the second normal event IVst2, the incoming place is the output terminal X22 of the inverter element 22 (FIG. 9), the incoming time is time tf0a which is the falling delay time tdHL22 of the inverter element 22 added to the current time tf0, and the renewed signal value is "0". This completes the incoming process for the first normal event IVst1.

As the time passes, the current time is updated by the incoming time tf1 of the self incoming event IVid1. When the self incoming event IVid1 is selected at the current time tf1, the processor section 1b generates a new third normal event IVst3 and a second self incoming event IVid as mentioned above. In the third normal event IVst3, the incoming time is the current time tf1, the incoming place is the output terminal X21, and the updated signal value is the inverted value of the signal at the output terminal X21 or "0". In the second self incoming event IVid2, the incoming time is time tf2 (=tf1+(Tk/2)) which is a half the fixed period Tk of the fixed-period oscillator element 21 added to the current time tf1, and the incoming place is the output terminal X21. The second self incoming event IVid2 is a special event and does not have an updated signal value. The processor section 1b affixes information of the target event being a special event affixed to the second self incoming event IVid2 and then terminates the incoming process for the self incoming event IVid1.

Thereafter, every time interval of Tk/2, the processor section 1b sequentially generates self incoming events and normal events in which the incoming place is the output terminal X21. Further, the processor section 1b carries out an incoming process based on those normal events to sequentially generate normal events in which the output terminal X22 is the incoming place.

In the incoming process specifically discussed above, the oscillation signal of the fixed-period oscillator element 21 at the output terminal X21 is simulated. Unlike in the prior art, therefore, it is unnecessary to form an input terminal for the initialization signal, which does not originally exist, in the logical model of the fixed-period oscillator element 21. As a result, the logical model and physical model of the fixed-period oscillator element 21 have a common terminal structure and are stored in a single master library.

As the logical model of the fixed-period oscillator element is a single cell, the speed of logic simulation is improved as compared with the case of an oscillator element which comprises a plurality of cells (inverter elements).

Before describing an incoming process for a logic circuit which comprises a PLL element 31 (see FIG. 10), the operation of the PLL element 31 will be discussed.

Referring to FIG. 10, the PLL element 31 has an input terminal for receiving the external clock REF as the comparison signal, and an input terminal for receiving the feedback signal FB. The output terminal X31 of the PLL element 31 is connected to a circuit 32 formed on the feedback path. The circuit 32 sends the oscillation signal from the output terminal X31 to a frequency divider 33. The frequency divider 33 frequency-divides the oscillation signal from the circuit 32 and sends the resultant signal as the feedback signal FB to the input terminal of the PLL element 31.

Figure 15:
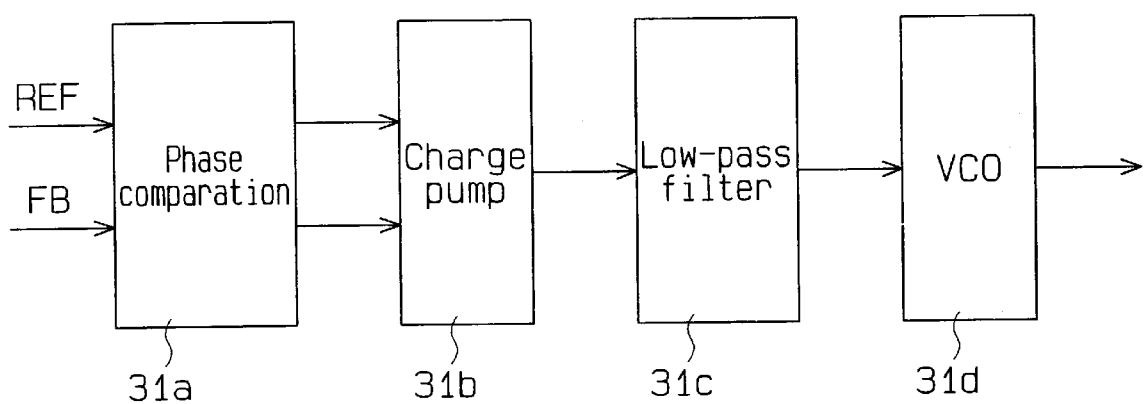
FIG. 15 is an equivalent block circuit diagram of the PLL element of FIG. 10.

The PLL element 31 is expressed with an equivalent circuit, as shown in FIG. 15. The equivalent circuit of the PLL element 31 comprises a phase comparator 31a, a charge pump 31b, a low-pass filter 31c and a VCO 31d. In accordance with the phase difference ±dt detected by the phase comparator 31a, the PLL element 31 controls the voltage applied to the VCO 31d to control the oscillation period. For the PLL element 31, a variation in the oscillation period of the VCO 31d with respect to the phase difference ±dt, which is approximated by a linear function, is given by an inclination parameter "r" of the VCO 31 characteristic. The processor section 1b performs processes for the following respective cases A to I to determine the oscillation period Tn+1 of the VCO 31d in accordance with the phase difference ±dt. The previous oscillation period is expressed by Tn, the period of the external clock REF is given by Tref, the period of the feedback signal FB is given by Tfb, and the time is indicated by t.

Case A: When the external clock REF rises with the PLL element 31 in standby mode. In this case, the oscillation period Tn+1 is not determined.

1. Update the period Tref of the external clock REF.

2. Set the rising time of the external clock REF as a registered time M.

Case B: When the feedback signal FB rises after the rising of the external clock REF. That is the case where the phase of the external clock REF leads that of the feedback signal FB.

1. Update Tfb.

2. Acquire dt=t−M (the time registered in the action "2" in case "A") where dt is the phase difference.

3. When Tref>Tfb or Tfb is unmeasured, $$Tn+1=Tn \tag{1}$$

4. When Tref<Tfb or Tref=Tfb, $$Tn+1=Tn-r\times dt \tag{2}$$

Case C: When the external clock REF rises again. That is either the case where the phase of the external clock REF still leads that of the feedback signal FB or the case where the output of the feedback signal FB is stopped.

1. Update Tref.

2. Acquire dt=t−M (the time registered in the action "2" in case "A" or the action "4" in case "C" which will be discussed later) where dt is the period of the external clock REF.

3.

$$Tn+1=Tn-r\times dt \tag{3}$$

4. Register the time of the rising of the external clock REF as M.

Case D: When the external clock REF and the feedback signal FB rise after the rising of the external clock REF. That is, the case where the state of the phase of the external clock REF leading that of the feedback signal FB is changed to the state that the clock REF and the signal FB have no phase difference and the PLL element 31 is set in the standby mode.

1. Update Tref and Tfb.
2. Acquire dt=t−M (the time registered in the action "2" in case "A" or the action "4" in case "C") where dt is the phase difference.
3. When Tref>Tfb or Tfb is unmeasured, $$Tn+1=Tn \qquad (4).$$

4. When Tref<Tfb or Tref=Tfb, $$Tn+1=Tn-r \times dt \qquad (5).$$

Case E: When the feedback signal FB rises with the PLL element 31 in standby mode. That is, the case where the phase of the external clock REF is delayed from that of the feedback signal FB in standby mode. In this case, the oscillation period Tn+1 is not determined.

1. Update Tfb.
2. Set the rising time of the feedback signal FB as the registered time M.

Case F: When the external clock REF rises after the rising of the feedback signal FB. That is, the case where the phase of the external clock REF is delayed from that of the feedback signal FB.

1. Update Tref.
2. Acquire dt=t−M (the time registered in the action "2" in case "E") where dt is the phase difference.
3. When Tref<Tfb or Tfb is unmeasured, $$Tn+1=Tn \qquad (6).$$

4. When Tref>Tfb or Tref=Tfb, $$Tn+1=Tn+r \times dt \qquad (7).$$

Case G: When the feedback signal FB rises again after it has risen. This is either the case where the phase of the external clock REF is delayed from that of the feedback signal FB or the case where the output of the external clock REF is stopped.

1. Update Tfb.
2. Acquire dt=t−M (the time registered in the action "2" in case "E" or the action "4" in case "G" which will be discussed later) where dt is the period of the feedback signal FB.
3.

$$Tn+1=Tn+r \times dt \qquad (8).$$

4. Register the time of the rising of the feedback signal FB as M.

Case H: When the external clock REF and the feedback signal FB rise after the rising of the feedback signal FB. That is, the case where the state of the phase of the external clock REF is delayed from that of the feedback signal FB is changed to the state that the clock REF and the signal FB have no phase difference and the PLL element 31 is set in the standby mode.

1. Update Tref and Tfb.
2. Acquire dt=t−M (the time registered in the action "2" in case "E" or the action "4" in case "G") where dt is the phase difference.
3. When Tref<Tfb, $$Tn+1=Tn \qquad (9).$$

4. When Tref>Tfb or Tref=Tfb, $$Tn+1=Tn+r \times dt \qquad (10).$$

Case I: When the external clock REF and the feedback signal FB simultaneously rise from the standby mode. This is, the standby mode where the phase of the external clock REF coincides with the phase of the feedback signal FB.

1. Renew Tref and Tfb.
2.

$$Tn+1=Tn \qquad (11)$$

Figure 16:
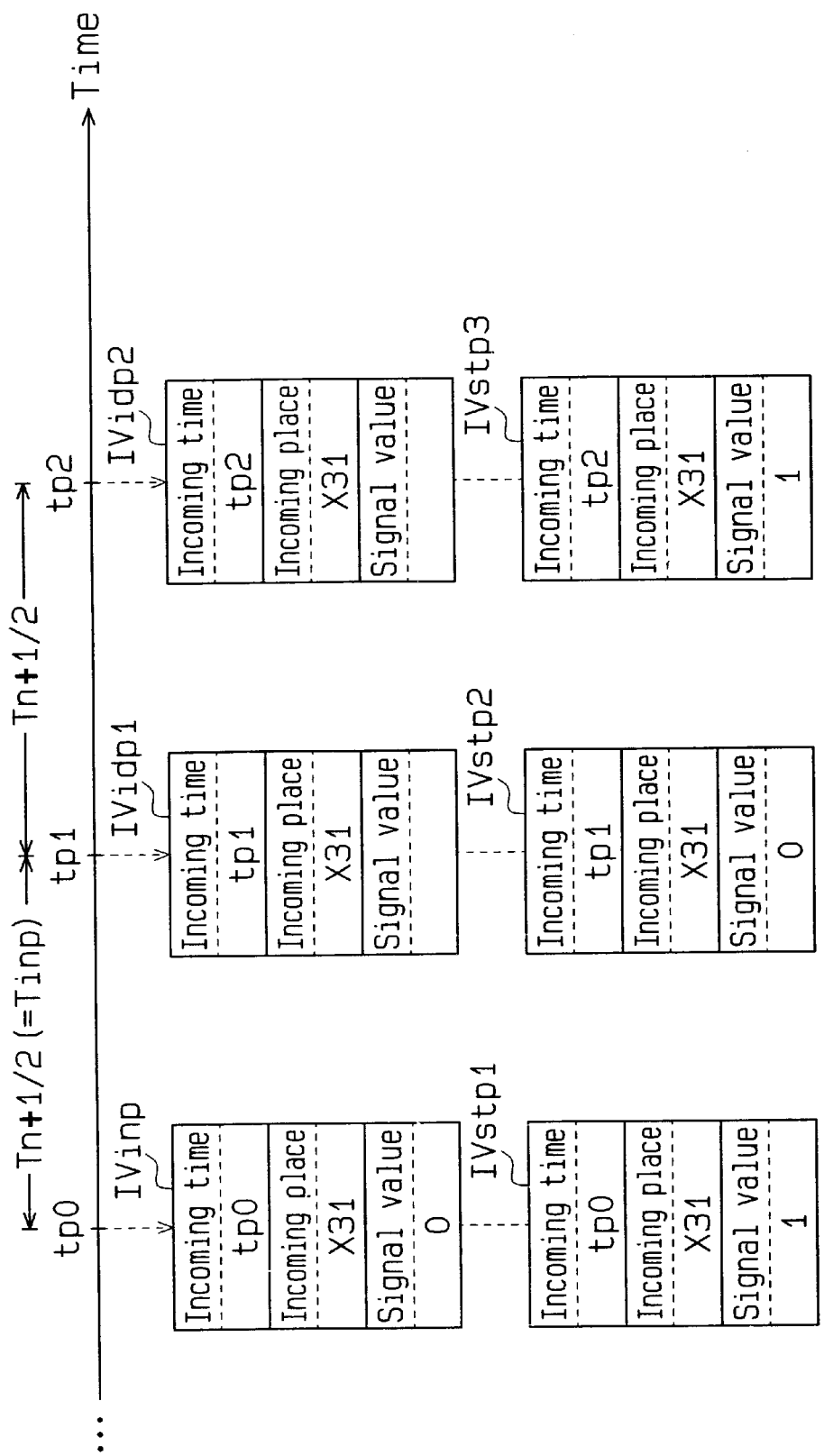
FIG. 16 is a block diagram showing events which are generated with respect to the PLL element of FIG. 10.

An incoming process for the PLL element 31 will be described below referring to FIG. 16. In the incoming process, the output terminal X31 of the PLL element 31 is the incoming place.

With the initialization of the logic circuit completed, an initial self incoming event IVinp is generated in which the oscillation start time tp0 of the PLL element 31 is the incoming time and the output terminal X31 of the PLL element 31 is the incoming place. Alternatively, an initial signal of "1" or "0" is given to the output terminal X31 of the PLL element 31. In this case, the initial signal is "0" for the sake of descriptive convenience.

Information of the target event being a special event is affixed to the initial self incoming event Ivinp based on data added to the logic cell data of the PLL element 31.

When the initial self incoming event IVinp, whose incoming time is the current time (oscillation start timing) tp0 and whose incoming place is the output terminal X31 of the PLL element 31, is selected, the processor section 1b generates a normal event IVstp1 for transferring a signal change to the circuit 32 (FIG. 10) at the subsequent stage. In the normal event IVstp1, the incoming time is the current time tp0, the incoming place is the output terminal X31 of the PLL element 31 and the updated signal value is the initial value inverted ("1").

Next, the processor section 1b generates a self incoming event IVidp1 as a special event. In the self incoming event IVidp1, the incoming time is time tp1 (=tp0+(Tn+1/2)) that is a half period of the period Tn+1of the PLL element 31 added to the current time tp0, and the incoming place is the output terminal X31 of the PLL element 31. The self incoming event IVidp1 does not have an updated signal value. Note that the PLL element 31 oscillates in a period Tinp with a predetermined initial value at the current time tp0 (oscillation start time). At the current time tp0, therefore, the period Tn+1of the PLL element 31 then is set to a period Tinp. As a result, the time tp1 is set as an equation below.

$$tp1=tp0+(Tn+1/2)=tp0+(Tinp/2).$$

The reason why the incoming time of the self incoming event IVidp1 has been determined as the time tp1 will now be discussed. The output signal of the PLL element 31 is an oscillation signal of a period Tn+1, and its value is inverted every half period (=Tn+1/2). To simulate the oscillating operation of the PLL element 31, therefore, it is necessary to generate a new event at a time at which the signal value is inverted.

The external clock REF, for example, may be measured, so that its period can be used as the initial period Tinp. In this case, the external clock REF may be output as the oscillation signal until the period of this external clock REF is measured.

The processor section 1b affixes information of the target event being a special event to the self incoming event IVidp1 and then terminates the generation of the self incoming event IVidp1.

Then, when the normal event IVstp1 is selected for an incoming process at the current time tp0, the processor section 1b executes the incoming process for the normal event IVstp1 to check the generation of a new normal event and generate it. Through this process, a new event for the logic cell in the circuit 32 (see FIG. 10) at the subsequent stage is generated and registered.

When the external clock REF or feedback signal FB which is to be input to the PLL element 31 changes before the current time reaches the incoming time tp1 (=tp0+(Tinp/2)) of the self incoming event IVidp1, the processor section 1b performs an arithmetic operation for a new oscillation period Tn+1.

The processor section 1 determines to which one of the cases A to I the change belongs, and renews the period Tref, Tfb of the external clock REF or the feedback signal FB. When the change belongs to one of the cases B to D and F to I, the processor section 1b sets a new oscillation period Tn+1 of the PLL element 31 in accordance with the associated equations (1) to (11).

As the time passes, the current time reaches the incoming time tp1. When the self incoming event IVidp1 is selected for an incoming process at the current time tp1, the processor section 1b executes an incoming process for the self incoming event IVidp1 in the same way as for the incoming process for the self incoming event IVidnp. That is, the processor section 1b generates a new second normal event IVstp2 and a second self incoming event IVidp2. In the second normal event IVstp2, the incoming time is the current time tp1, the incoming place is the output terminal X31 of the PLL element 31 and the updated signal value is The second self incoming event IVidp2 is a special event in which the incoming time is time tp2 (=tp1+(Tn+1/2)) which is a half the oscillation period Tn+1 of the PLL element 31 added to the current time tp1, and the incoming place is the output terminal X31 of the PLL element 31. The oscillation period Tn+1 which is used in the arithmetic operation for the incoming time tp2 is the time that the processor section 1b has acquired in accordance with the equations (1) to (11) before the incoming time tp1 of the second self incoming event IVidp2. The second self incoming event IVidp2, like the self incoming event IVidp1, does not have an updated signal value. The processor section 1b finishes the generation of the second self incoming event IVidp2 after affixing information of the target event being a special event to the second self incoming event IVidp2.

Thereafter, a similar process is carried out to repeat the generation of new self incoming events and normal events, thereby setting the oscillation period Tn+1 for the PLL element 31 in accordance with the equations (1) to (11) based on the phase difference dt between the external clock REF and the feedback signal FB. That is, to oscillate a signal in the occasionally set oscillation period Tn+1, the self incoming events IVidp1, IVidp2 and so forth and the normal events IVstp1, IVst2, IVst3 and so forth are generated.

In other words, the oscillating operation in the oscillation period Tn+1 according to the phase difference dt between the external clock REF and the feedback signal FB is simulated by setting the initial signal and the oscillation timing tp0 and generating the self incoming events. Unlike in the prior art, therefore, it is unnecessary to form an input terminal for the initialization signal, which does not originally exist, for the logical model of the PLL element 31. As a result, the logical model and physical model of the PLL element 31 have a common terminal structure and are stored in a single master library.

Figure 1:
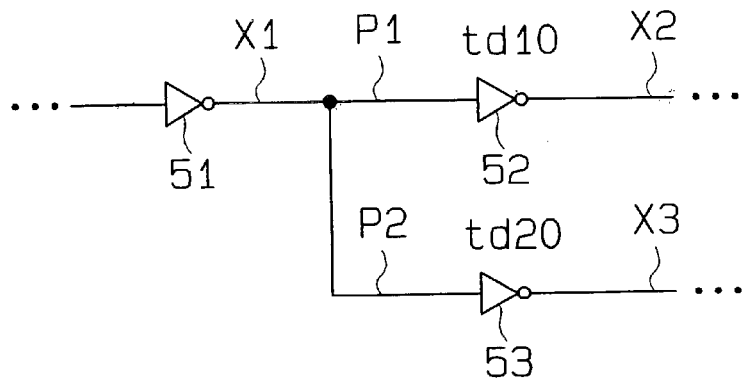
FIG. 1 is a schematic diagram showing a part of a logic circuit.
Figure 2:
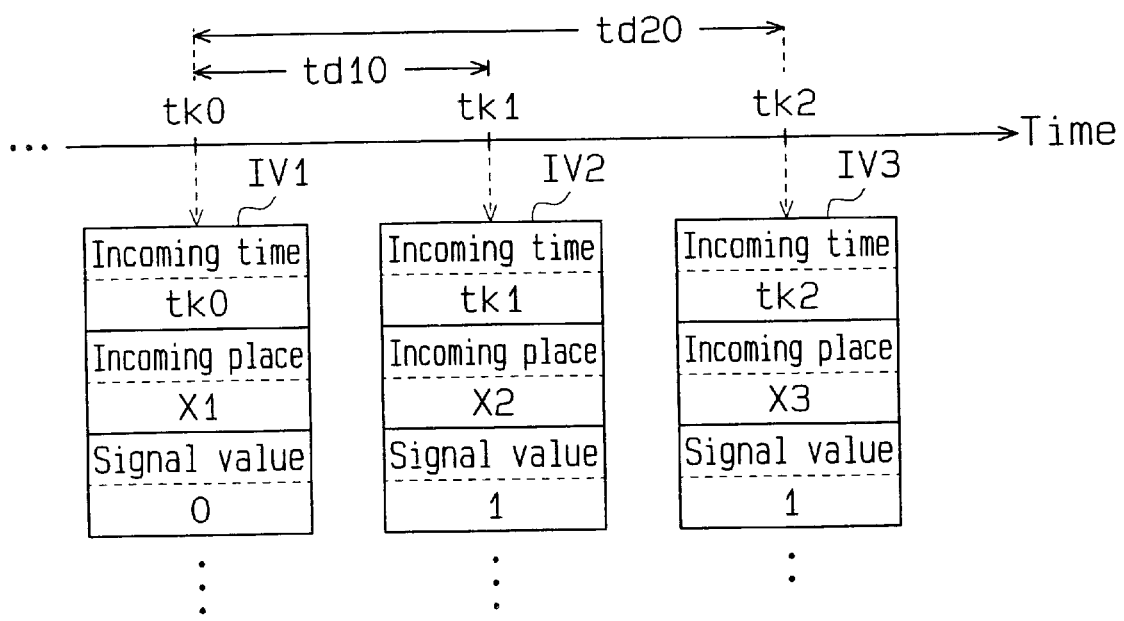
FIG. 2 is a block diagram illustrating events which are generated with respect to the logic circuit of FIG. 1.
Figure 3:
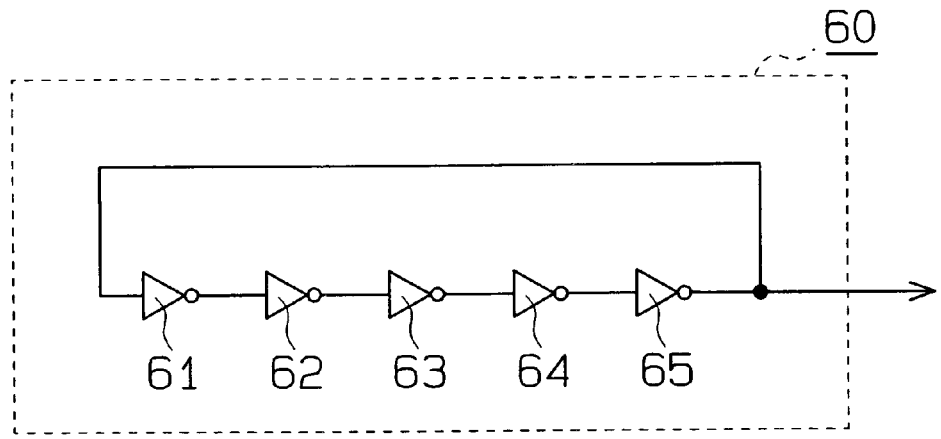
FIG. 3 is a schematic diagram depicting the structure of logic cells of a fixed-period oscillator element.
Figure 4:
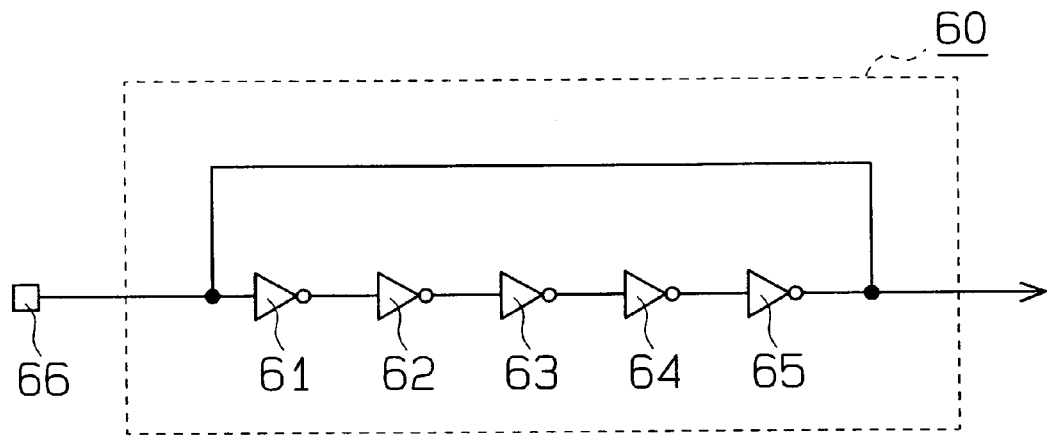
FIG. 4 is a schematic diagram showing a logic cell model in a conventional logic test.
Figure 5:
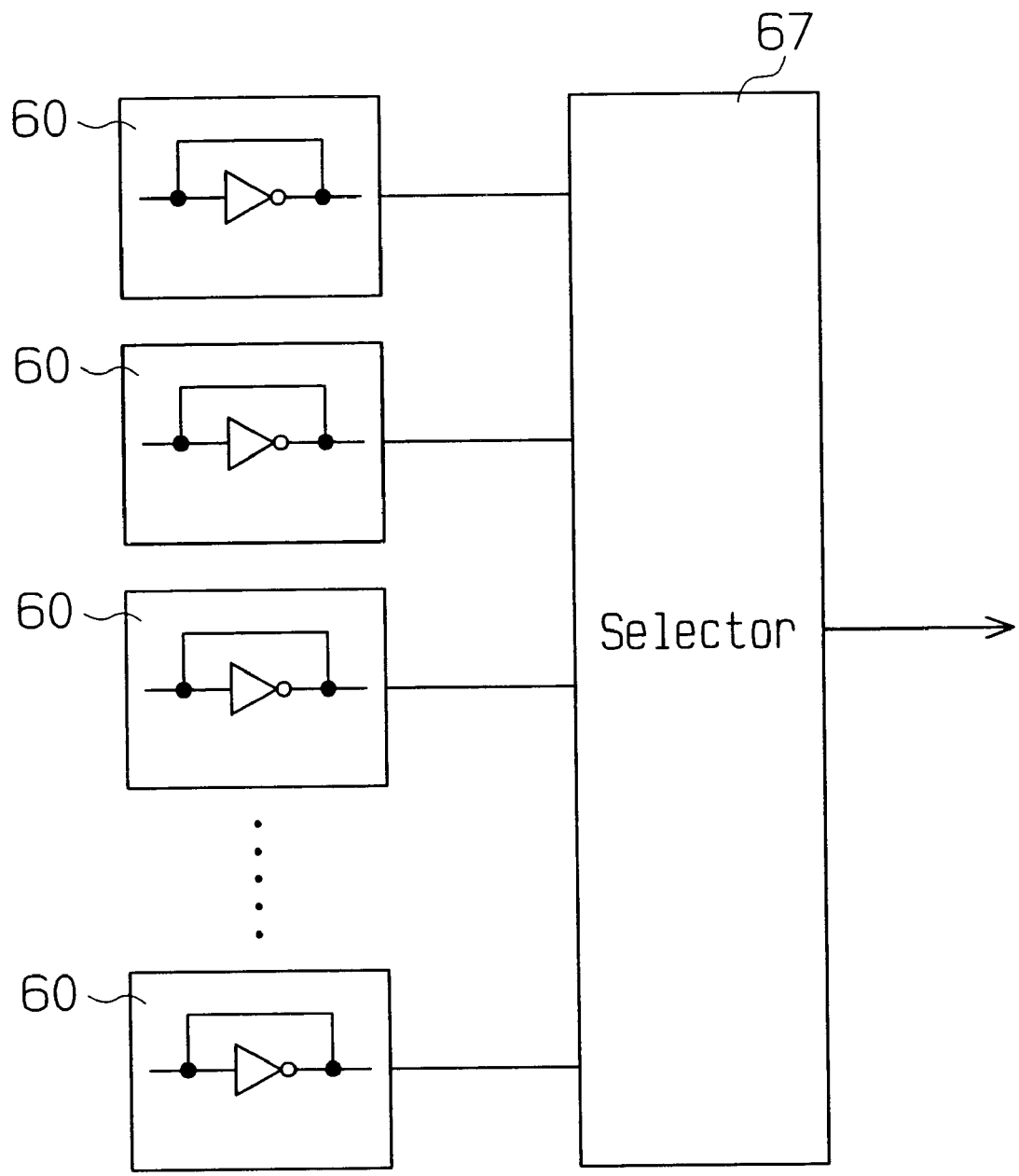
FIG. 5 is a block diagram showing a logical model of a conventional VCO.
Figure 6:
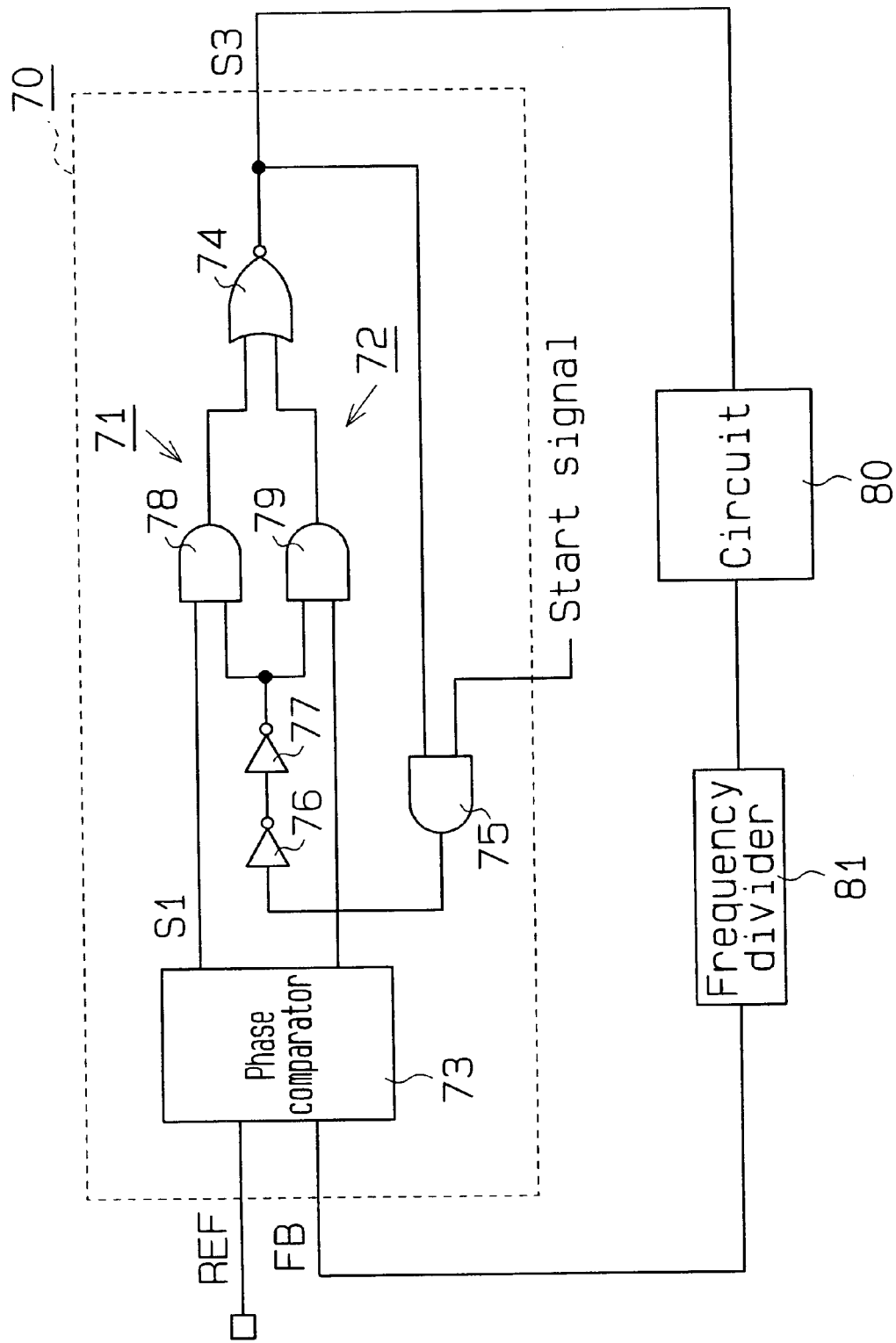
FIG. 6 is a circuit diagram depicting a logical model of a conventional PLL element.

As the logical model of the PLL element 31 is a single cell, the simulation speed of logic test is improved as compared with the case of an oscillator element (FIGS. 5 and 6) which comprises a plurality of cells.

Further, the spontaneous oscillation period is adjusted in the logical model of the PLL element 31. That is, the oscillation period Tn+1 is set by using the equations (1) to (11) according to the phase difference dt between the external clock REF and the feedback signal FB. Therefore, logic testing which is responsive to changes in the external clock REF and the frequency-dividing ratio is carried out in the logic testing on a logic circuit including the PLL element 31.

In the logic testing on a logic circuit including the PLL element 31, when the feedback signal FB is stopped due to a logical error in the circuit 32, a signal with an oscillation period Tn+1 responsive to the disabling of the signal FB is output. As a result, a user can find a logical error in the circuit 32 based on the signal with the oscillation period Tn+1.

Therefore, the present examples and embodiments are to be considered as illustrative and not restrictive and the invention is not to be limited to the details given herein, but may be modified within the scope and equivalence of the appended claims.

What is claimed is:

1. A method of performing a logic test of a logical operation on each of a plurality of logic elements in a logic circuit in an event driven system, based on input data of the logic circuit and net list data of a fan-in-fan-out structure of the logic circuit, at least one of the logic elements including an oscillator element, the method comprising the steps of:

provividing a self incoming event of the oscillator element, the self incoming event having a signal incoming time and a signal incoming place, indicating a change in a signal by oscillation of the oscillator element; and performing an incoming process for the self incoming event, the incoming process performing the substeps of:

generating a normal event having the same incoming time and the same incoming place as the self incoming event; and generating a new self incoming event having the same incoming place as the self incoming event and a changing time of a signal caused by oscillation of the oscillator element as a signal incoming time, the changing time being later than the incoming time of the self incoming event.

2. The logic testing method according to claim 1, further comprising a step of performing an incoming process for the normal event.

3. The logic testing method according to claim 2, further comprising a step of repeating the steps of performing the incoming process for the self incoming event and the normal event.

4. The logic testing method according to claim 3, wherein the new self incoming event generating substep includes the step of adding a portion of the computed oscillation period to the incoming time of the self incoming event to compute the incoming time of the new self incoming event.

5. The logic testing method according to claim 3, wherein the new self incoming event generating substep includes the steps of:

computing an oscillation period of the oscillation element according to a phase difference between a clock signal and a feedback signal, which are input to the oscillator element; and adding a portion of the computed oscillation period to the incoming time of the self incoming event to compute the incoming time of the new self incoming event.

6. The logic testing method according to claim 5, wherein the oscillation period computing step includes the step of compensating the computed oscillation period of the oscillator element.

7. The logic testing method according to claim 5, wherein the oscillation period computing step is executed when one of the clock signal and the feedback signal changes.

8. A logic testing apparatus for performing a logic test of a logical operation on each of a plurality of logic elements in a logic circuit in an event driven system, at least one of the logic elements including an oscillator element, the apparatus comprising:

a memory for storing logic circuit input data and net list data of the logic circuit; and a processor for processing a normal event and a self incoming event with regard to the oscillator element;

wherein the processor operates to:

provide a self incoming event to the oscillator element, the incoming event having a signal incoming time and a signal incoming place, indicating a change in a signal by oscillation of the oscillator element; and perform an incoming process for the self incoming event for generating a normal event having the same incoming time and the same incoming place as the self incoming event; and for generating a new self incoming event having the same incoming place as the self incoming event and a changing time of the oscillation signal caused by oscillation of the oscillator element as a signal incoming time, the changing time being later than the incoming time of the self incoming event.

9. The logic testing apparatus according to claim 8, wherein the processor further performs an incoming process for the normal event.

10. The logic testing apparatus according to claim 9, wherein the processor further repeats performing the incoming process for the self incoming event and the normal event.

11. The logic testing apparatus according to claim 10, wherein at a time of generating the new self incoming event, the processor adds a portion of the computed oscillation period to the incoming time of the self incoming event to compute the incoming time of new self incoming event.

12. The logic testing apparatus according to claim 10, wherein the oscillator element inputs a clock signal and a feedback signal at a time of generating the self incoming event, the processor computes an oscillation period according to a phase difference between the clock signal and the feedback signal, and the processor adds a portion of the computed oscillation period to the incoming time of the self incoming event to compute the incoming time of new self incoming event.

13. The logic testing apparatus according to claim 12, wherein the processor compensates the computed oscillation period of the oscillator element at a time of computing an oscillation period.

14. The logic testing apparatus according to claim 10, wherein the oscillator element includes a fixed-period oscillator element for outputting a signal which oscillates in a predetermined period; and at a time of generating the new self incoming event, the processor adds a portion of the computed oscillation period to the signal incoming time of the self incoming event to compute the incoming time of new self incoming event.

15. The logic testing apparatus according to claim 10, wherein the oscillator element includes a variable oscillator element for outputting an oscillation signal with a variable oscillation period, the variable oscillator inputs a clock signal and a feedback signal, wherein at a time of generating the self incoming event, the processor computes an oscillation period according to a phase difference between the clock signal and the feedback signal to compute a current oscillation period, and wherein the processor adds a portion of the computed oscillation period to compute the incoming time of new self incoming event.

16. A storage medium having computer readable program code thereon for performing logic testing of a logical operation on each of a plurality of logic elements in a logic circuit in an event driven system, at least one of the logic elements including an oscillator element, the logic testing being performed based on logic circuit input data and net list data of a fan-in-fan-out structure, the program code executing the steps of:

providing a self incoming event to the oscillator element, the self incoming event having a signal incoming time and a signal incoming place, indicating a change in a signal by oscillation of the oscillator element; and performing an incoming process for the self incoming event, the incoming process performing the substep of:

generating a normal event having the same incoming time and the same incoming place as the self incoming event; and generating a new self incoming event having the same incoming place as the self incoming event and a changing time of a signal caused by oscillation of the oscillator element as a signal incoming time, the changing time being later than the incoming time of the self incoming event.

17. The storage product according to claim 16, wherein the program code executes an incoming process for the normal event.

18. The storage product according to claim 17, wherein the program code executes a step for repeating the steps of performing the incoming process for the self incoming event and the normal event.

19. The storage product according to claim 18, wherein the self incoming event generating step includes adding a portion of the computed oscillation period to the incoming time of the self incoming event to compute an incoming time of the new self incoming event.

20. The storage product according to claim 18, wherein the self incoming event generating step includes the steps of:

computing an oscillation period according to a phase difference between a clock signal and a feedback signal input to the oscillator element; and adding a portion of the computed oscillation period to the incoming time of the self incoming event to compute the incoming time of new self incoming event.

21. The storage product according to claim 20, wherein the oscillation period computing step includes the step of compensating the computed oscillation period of the oscillator element.

* * * * *